United States Patent
Ling

(10) Patent No.: US 9,722,843 B2
(45) Date of Patent: Aug. 1, 2017

(54) ALIASING ENHANCED OFDM COMMUNICATIONS

(71) Applicant: Maxlinear, Inc., Carlsbad, CA (US)

(72) Inventor: Curtis Ling, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

(21) Appl. No.: 15/079,862

(22) Filed: Mar. 24, 2016

(65) Prior Publication Data
US 2016/0285598 A1    Sep. 29, 2016

Related U.S. Application Data

(60) Provisional application No. 62/137,781, filed on Mar. 24, 2015.

(51) Int. Cl.
*H04L 27/06* (2006.01)
*H03M 1/06* (2006.01)
*H04L 27/26* (2006.01)

(52) U.S. Cl.
CPC ...... *H04L 27/2628* (2013.01); *H03M 1/0629* (2013.01); *H04L 27/2647* (2013.01)

(58) Field of Classification Search
CPC . H04L 5/0001; H04L 5/0007; H04L 27/0002; H04L 27/2625; H04L 27/2628; H04L 27/263; H04L 27/2634; H04L 27/265; H04L 27/2666; H04L 27/2647; H03M 1/0629
USPC ........ 375/259–262, 265, 267; 370/208, 210; 708/400–405
See application file for complete search history.

(56) References Cited

U.S. PATENT DOCUMENTS

| | | | | |
|---|---|---|---|---|
| 8,380,144 B1* | 2/2013 | Bai | ................. | H03F 1/3247 375/296 |
| 2009/0232234 A1* | 9/2009 | Du | ................. | H04B 7/2621 375/260 |
| 2012/0281550 A1* | 11/2012 | Huang | .............. | H04B 1/0475 370/249 |
| 2013/0034140 A1* | 2/2013 | Kil | .................. | H04L 25/022 375/224 |
| 2013/0084821 A1* | 4/2013 | Kapoor | ............ | H04B 1/1036 455/307 |
| 2015/0146826 A1* | 5/2015 | Katabi | ............. | H04L 27/265 375/340 |
| 2016/0036561 A1* | 2/2016 | Stopler | ............ | H04L 1/0045 714/776 |

(Continued)

*Primary Examiner* — Young T Tse
(74) *Attorney, Agent, or Firm* — McAndrews, Held & Malloy, Ltd.

(57) ABSTRACT

A system comprises an analog front end (AFE), an analog-to-digital converter (ADC), and alias detection circuitry. The AFE may be operable to receive an analog signal via a communication medium, wherein a first frequency band of the analog signal is occupied by an OFDM symbol and a second frequency band of the analog signal is occupied by first aliases generated during digital-to-analog conversion of the OFDM symbol. The ADC is operable to digitize the particular band of the analog signal to generate a digital signal, wherein, during the digitization, aliasing of the first aliases results in second aliases which fall into the first frequency band. The alias detection circuitry is operable to detect the second aliases in the first frequency band of the digital signal, and process the digital signal based on the detected second aliases to generate an output signal.

20 Claims, 3 Drawing Sheets

(56) References Cited

U.S. PATENT DOCUMENTS

2016/0065275 A1* 3/2016 Reuven ............... H04B 7/0413
375/267

* cited by examiner

ALIASING ENHANCED OFDM COMMUNICATIONS

PRIORITY CLAIM

This application claims priority to the following application, which is hereby incorporated herein by reference: U.S. provisional patent application 62/137,781 titled "ALIASING ENHANCED OFDM COMMUNICATIONS" filed on Mar. 24, 2015.

BACKGROUND

Limitations and disadvantages of conventional and traditional approaches to electronic communications will become apparent to one of skill in the art, through comparison of such systems with some aspects of the present invention as set forth in the remainder of the present application with reference to the drawings.

BRIEF SUMMARY OF THE INVENTION

Systems and methods are provided for aliasing enhanced OFDM communications, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Figure 4:
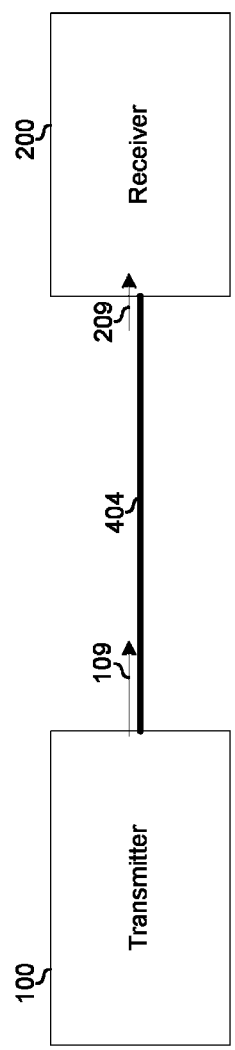
FIG. 4 shows example devices which communicate over a communication medium.

Referring first to FIG. 4, there is shown a transmitter 100 which communicates over medium 404 with receiver 200.

In an example implementation in which the transmitter 100 and receiver 200 operate in a closed environment the medium 404 may be air/free space. For example, the transmitter 100 and receiver 200 may reside in a shielded enclosure/housing of a computing device. As another example, the transmitter 100 and receiver 200 may reside in room or building (e.g., a data center) which is electromagnetically shielded/isolated to prevent interference from leaking into the surrounding environment.

Similarly, the medium 404 may be air/free space in an example implementation in which the transmission is at sufficiently low power such that spectral mask requirements permit transmission of the aliases up to $f_{RF}+B$. For example, the devices 100 and 200 may be broadband near-field communication devices which permissibly operate on frequencies allocated for other types of communications (e.g., frequencies allocated for television broadcast) due to the fact that the transmit power is below the spurious emissions mask specified (e.g., by FCC or other regulatory body) for such frequencies.

In an example implementation, the medium may be a conductive/wired medium (e.g., coaxial cabling, twisted-pair cabling, backplane, and/or the like). For example, the devices 100 and 200 may be devices which communicate over coaxial cable used for MoCA, DOCSIS, and/or CaTV in a building. As another example, the device 100 may be a fiber node and the device 200 may be a cable modem.

In an example implementation, the medium may be fiber optic cable. For example, the device 100 may be a CMTS and the device 200 may be a fiber node.

Figure 1:
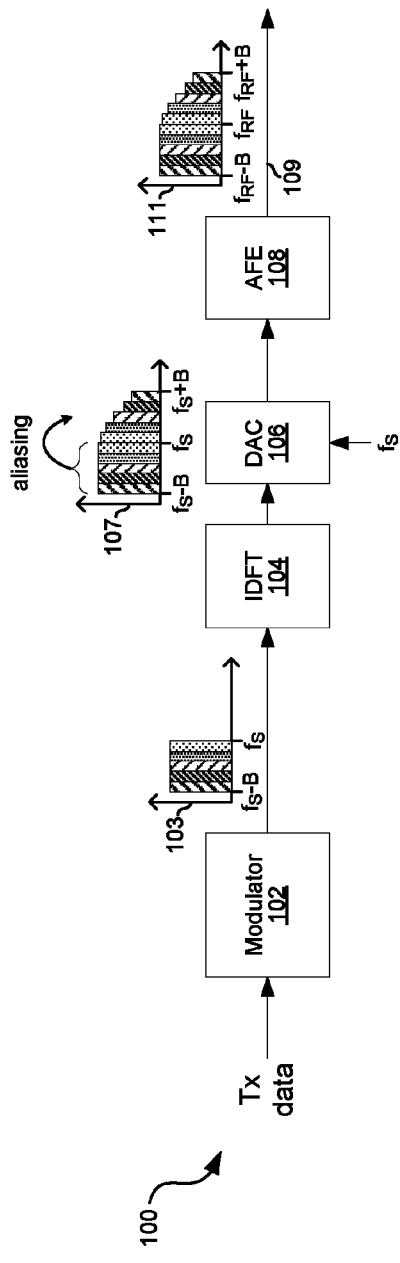
FIG. 1 is a diagram of components of a transmitter in accordance with an example implementation of this disclosure.

Now referring to FIG. 1 is a diagram of components of a transmitter in accordance with an example implementation of this disclosure. The example transmitter 100 comprises a modulator 102, an inverse discrete Fourier transform (IDFT) circuit 104, a digital-to-analog converter (DAC) circuit 106, and an analog front end (AFE) circuit 108.

In operation, the modulator 102 generates modulates the Tx data onto a baseband signal. A spectral density chart 103 for an example output of the modulator 102 is shown, with each bin represented by a differently-filled rectangle. The example signal comprises five bins from frequency $f_S-B$ to frequency $f_S$, where the number of five subcarriers/bins was chosen arbitrarily for simplicity of illustration (there may be any number of subcarriers per OFDM symbol). The IFDT 104 converts the output of the modulator 102 to the time domain.

The DAC 106 then converts the digital signal to an analog representation using a sampling clock operating at frequency $f_S$. The spectral density chart 107 illustrates aliasing that occurs during the conversion to analog. Specifically, aliases falling at frequencies from $f_S$ to $f_S+B$ are shown, where B is an integer or fractional number of hertz. In an example implementation, the aliases are not filtered out. That is, in example implementations in which a baseband signal is output onto the medium 404, the frequency response of the DAC 208 and any other downstream circuitry between the DAC and the medium 404 has a cutoff frequency (e.g., measured as 3 dB or some other determined criteria) at least as high as $f_S+B$. In example implementations in which the transmitter 100 performs upconversion to frequency $f_{RF}$ prior to transmission onto the medium 404, the DAC 106 and any other downstream baseband components may have a cutoff frequency at least as high as $f_S+B$ and any RF components of the transmitter may have a cutoff frequency at least as high as $f_{RF}+B$. The AFE 108 processes the DAC output (e.g., amplifies it and upconverts it) for output onto the medium 404. The spectral density chart 111 illustrates that signal 109 includes the aliases generated by DAC 106.

Figure 2:
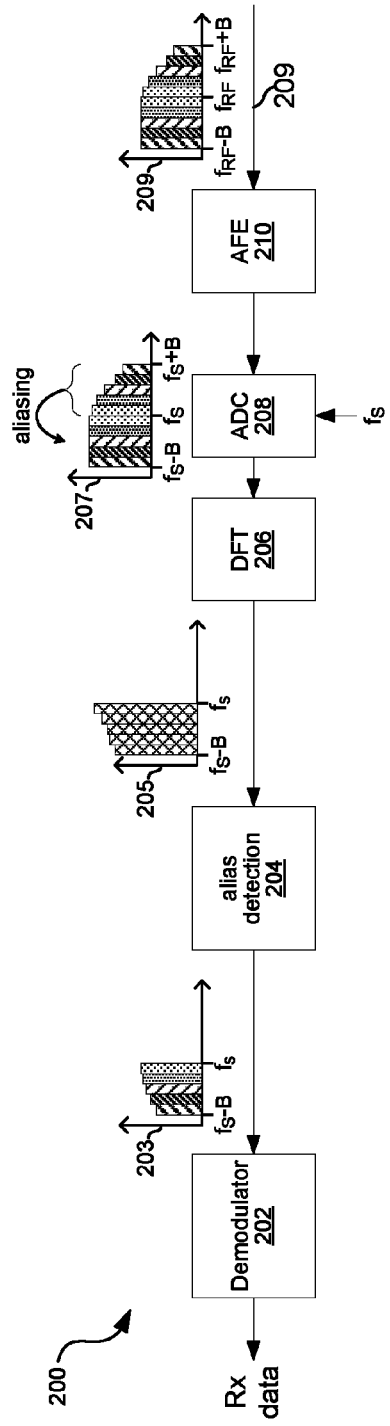
FIG. 2 is a diagram of components of a receiver in accordance with an example implementation of this disclosure.

FIG. 2 is a diagram of components of a receiver in accordance with an example implementation of this disclosure. The example receiver 200 depicted comprises an AFE circuit 210, a digital-to-analog converter (DAC) circuit 208, a discrete Fourier transform (DFT) circuit 206, an alias detection circuit 204, and a demodulator 202.

In operation, signal 209—corresponding to signal 109 after it has propagated over the medium 404—is processed by AFE 210 (e.g., amplified and downconverted, although in some instances downconversion may be unnecessary) to generate an RF analog signal which is conveyed to DAC 208. The AFE 210 is configured to pass the received signal, including the aliases generated by DAC 106, to the DAC 208.

The ADC 208 converts the analog signal, including the aliases generated by DAC 106 to a digital representation using a clock operating at $f_S$. The spectral density graph 207 illustrates the aliasing of the aliases from $f_S$ to $f_S+B$ back down in-band (from $f_S-B$ to $f_S$) as a result of the operation of the DAC 208.

The DFT 306 then converts the output of the DAC 208 to the frequency domain. The in-band portion of this signal output by the DFT 206 thus comprises the original in-band signal plus aliases that were folded back in-band by DAC 208.

The alias detection 204 circuit is operable to determine (e.g., using known blind source separation techniques) what these aliases are, and either cancel them from the in-band signal, or phase correct them and add their energy back to the in-band signal to improve the signal to noise ratio (SNR) of the in-band signal. In this regard, each in-band frequency bin of the signal output by DFT 206 may be represented as:

$$v'_i = v_i + c_i v^*_i$$

where $v'_i$ is received value of the subcarrier having index i, $v_i$ is the transmitted value of the subcarrier having index i, $c_i v^*_i$ is the alias that has folded back onto the subcarrier having index i, $v^*_i$ is the complex conjugate of $v_i$, and $c_i$ is a complex value. Thus, determining $c_i$ for the subcarrier having index i enables determining the alias component present in the subcarrier having index i. The alias component can then be cancelled and/or its energy calculated and phase corrected for adding to the in-band energy of the subcarrier having index i.

The output 203 of the alias detection circuit 204 is thus a cleaned, or possibly enhanced, signal suitable for demodulation. The demodulator 202 may then map the symbols back to bits.

Thus, no anti-aliasing filter is required for removing the aliases generated by DAC 106, no anti-aliasing filter is required for removing aliases generated by ADC 208, and the full bandwidth from $f_s-B$ to $f_s$ has been used for communicating data from device 100 to device 200.

Although the above assumes that the sampling frequency is precisely equal to the upper edge of the band occupied by the OFDM symbol, it may, of course be different by some tolerance (e.g., a tolerance of 10 ppm or 1 ppm).

Figure 3:
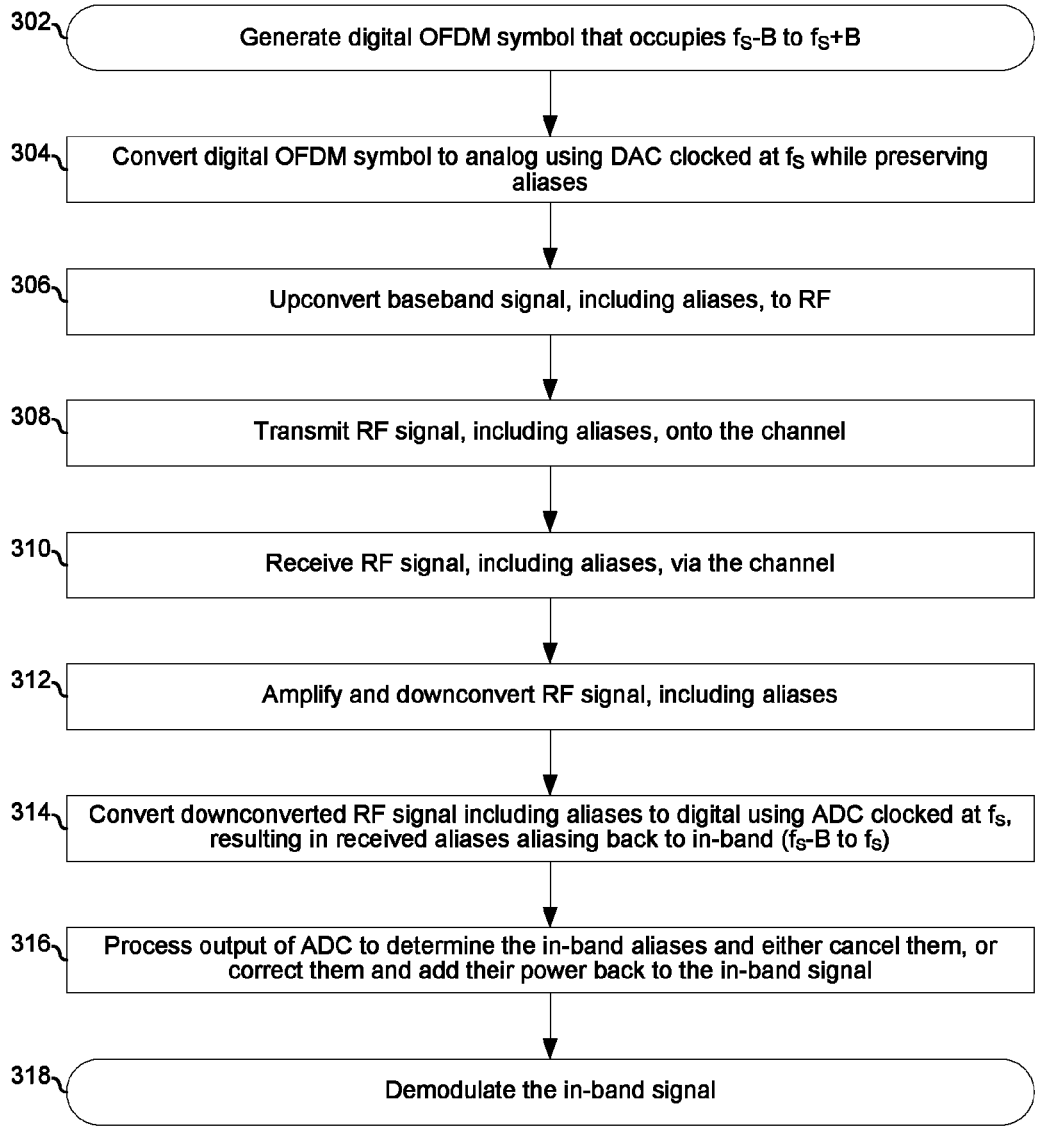
FIG. 3 is a flowchart illustrating an example process for communications between the transmitter of FIG. 1 and receiver of FIG. 2.

FIG. 3 is a flowchart illustrating an example process for communications between the transmitter of FIG. 1 and receiver of FIG. 2. In block 302, a digital OFDM symbol comprising a plurality of subcarriers occupying a frequency band from $f_S-B$ to $f_S+B$ is generated. In block 304, the digital OFDM symbol is converted to an analog representation using a DAC that is clocked at frequency $f_S$. The aliases resulting from the conversion are preserved in the analog signal. In block 306, the baseband signal, including the aliases generated by the DAC, is upconverted to RF. In block 308, the RF signal, including the upconverted aliases, is transmitted onto the medium 404. In block 310, the RF signal, including aliases generated by the DAC, arrives at the receiver. In block 312, the AFE of the receiver amplifies and, optionally, downconverts the received signal, including the aliases generated by the DAC. In block 314, the received signal is digitized by an ADC clocked at $f_S$. The result is a digital signal from $f_S-B$ to $f_S+B$. During the digitizing, the aliases generated by the DAC are again aliased such that they fold back in-band (into the subcarriers from $f_S-B$ to $f_S$). In block 316, the output of the ADC is processed to determine the in-band alias components and either cancel them or determine their energy or phase correct them and add their energy back to the in-band signal (thus providing an increase in SNR). In block 318, the in-band signal is demodulated.

In accordance with an example implementation of this disclosure, a system (e.g., receiver 200) comprises an analog front end (AFE) (e.g., 210), an analog-to-digital converter (ADC) (e.g., 208), and alias detection circuitry (e.g., 204). The AFE is operable to receive an analog signal via a communication medium (e.g., 404), wherein a first frequency band (e.g., $f_s-B$ to $f_s$) of the analog signal is occupied by an OFDM symbol and a second frequency band (e.g., $f_s$ to $f_s+B$) of the analog signal is occupied by first aliases generated during digital-to-analog conversion of the OFDM symbol. The ADC is operable to digitize the particular band of the analog signal to generate a digital signal, wherein, during the digitization, aliasing of the first aliases results in second aliases which fall into the first frequency band. The alias detection circuitry is operable to detect the second aliases in the first frequency band of the digital signal, and process the digital signal based on the detected second aliases to generate an output signal. The processing of the digital signal may comprise removal of the detected second aliases from the first frequency band of the digital signal. The processing of the digital signal may comprise removal of the detected second aliases from the first frequency band of the digital signal, phase adjustment of the extracted second aliases to generate phase-adjusted aliases, and addition of the phase-adjusted aliases to the first frequency band of the digital signal. The system may comprise a demodulator operable to demodulate the output signal. The system may comprise discrete Fourier transform (DFT) circuitry, wherein an output of the ADC is coupled to an input of the DFT circuitry. There may be no anti-aliasing filter circuitry that operates on signals communicated from the output of the ADC to the input of the DFT circuitry. The OFDM symbol may occupy a bandwidth of B Hz (plus or minus a tolerance), the first frequency band may have bandwidth of B Hz (plus or minus a tolerance), and the second frequency band may have a bandwidth of B Hz (plus or minus a tolerance).

In accordance with an example implementation of this disclosure, a system (e.g., transmitter 100) may comprise a digital-to-analog converter (DAC) (e.g., 106) and an analog front end (AFE) (e.g., 108). The DAC is operable to convert a digital signal that comprises a digital representation of a OFDM symbol to an analog signal that comprises: (1) an analog representation of the OFDM symbol, and (2) aliases generated during the conversion. The digital representation of the OFDM symbol spans from $f_s-B$ hertz to $f_s$ hertz of the digital signal, B hertz is the bandwidth of the OFDM symbol, $f_s$ hertz is the sampling frequency of the DAC (plus or minus a tolerance). The AFE is operable to process the analog signal to generate an output signal comprising: (1) the analog representation of the OFDM symbol, and (2) the aliases. The aliases may occupy B hertz of the output signal. An input of the AFE may be coupled to the output of the DAC. The system may not comprise an anti-aliasing filter operable to perform anti-aliasing filtering of signals communicated from the AFE to the DAC. The analog representation of the OFDM symbol and the aliases may occupy a band of the output signal that ranges from $f_s-B$ to $f_s+B$. The AFE may be operable to upconvert the analog signal centered at $f_{RF}$ hertz. The analog representation of the OFDM symbol and the aliases may occupy a band of the output signal that ranges from $f_{RF}-B$ to $f_{RF}+B$.

The present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present invention may be realized in a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

What is claimed is:

1. A system comprising:
an analog front end (AFE) configured to receive an analog signal via a communication medium, wherein a first frequency band of the analog signal is occupied by an Orthogonal Frequency Division Multiplexing (OFDM) symbol and a second frequency band of the analog signal is occupied by first aliases generated during digital-to-analog conversion of the OFDM symbol;
an analog-to-digital converter (ADC) configured to digitize a particular band of the analog signal to generate a digital signal, wherein, during the digitization, aliasing of the first aliases results in second aliases which fall into the first frequency band; and
alias detection circuitry configured to:
detect the second aliases in the first frequency band of the digital signal; and
process the digital signal based on the detected second aliases to generate an output signal.

2. The system of claim 1, wherein the processing of the digital signal comprises removal of the detected second aliases from the first frequency band of the digital signal.

3. The system of claim 1, wherein the processing of the digital signal comprises:
removal of the detected second aliases from the first frequency band of the digital signal;
phase adjustment of the detected second aliases to generate phase-adjusted aliases; and
addition of the phase-adjusted aliases to the first frequency band of the digital signal.

4. The system of claim 3, further comprising a demodulator configured to demodulate the output signal.

5. The system of claim 1, further comprising discrete Fourier transform (DFT) circuitry, wherein an output of the ADC is coupled to an input of the DFT circuitry.

6. The system of claim 5, wherein an antialiasing filter operates on signals communicated from the output of the ADC to the input of the DFT circuitry.

7. The system of claim 1, wherein:
the OFDM symbol occupies a bandwidth that is equal to a bandwidth of the first frequency band and a bandwidth of the second frequency band.

8. A method comprising:
receiving, in an analog front end (AFE) via a communication medium, an analog signal wherein a first frequency band of the analog signal is occupied by an Orthogonal Frequency Division Multiplexing (OFDM) symbol and a second frequency band of the analog signal is occupied by first aliases generated during digital-to-analog conversion of the OFDM symbol;
digitizing, by an analog-to-digital converter (ADC), a particular band of the received signal to generate a digital signal, wherein, during the digitizing, aliasing of the first aliases results in second aliases which fall into the first frequency band;
detecting, by alias detection circuitry, the second aliases in the first frequency band of the digital signal; and
processing, by the alias detection circuitry, the digital signal based on the detected second aliases, wherein the processing results in an output signal.

9. The method of claim 8, wherein the processing of the digital signal comprises removing the detected second aliases from the first frequency band of the digital signal.

10. The method of claim 8, wherein the processing of the digital signal comprises:
removing the detected second aliases from the first frequency band of the digital signal;
phase adjusting the detected second aliases to generate phase-adjusted aliases; and
adding the phase-adjusted aliases to the first frequency band of the digital signal.

11. The method of claim 10, further comprising demodulating, by a demodulator, the output signal.

12. The method of claim 8, wherein an output of the ADC is coupled to an input of discrete Fourier transform (DFT) circuitry.

13. The method of claim 12, wherein anti-aliasing filtering is performed on signals communicated from the output of the ADC to the input of the DFT circuitry.

14. The method of claim 8, wherein:
the OFDM symbol occupies a bandwidth that is equal to a bandwidth of the first frequency band and a bandwidth of the second frequency band.

15. A system comprising:
a digital-to-analog converter (DAC) configured to convert a digital signal that comprises a digital representation of an Orthogonal Frequency Division Multiplexing (OFDM) symbol to an analog signal that comprises an analog representation of the OFDM symbol and aliases generated during the conversion, wherein:
the digital representation of the OFDM symbol spans from fs−B hertz to fs hertz of the digital signal, wherein B is a bandwidth of the OFDM symbol, and
fs is a sampling frequency of the DAC; and
an analog front-end (AFE) configured to process the analog signal to generate an output signal comprising the analog representation of the OFDM symbol and the aliases.

16. The system of claim 15, wherein the aliases occupy B hertz of the output signal.

17. The system of claim 15, wherein:
an input of the AFE is coupled to an output of the DAC.

18. The system of claim 15, wherein the analog representation of the OFDM symbol and the aliases occupy a band of the output signal that ranges from fs−B to fs+B.

19. The system of claim 15, wherein the AFE is configured to upconvert the analog signal to a frequency band centered at $f_{RF}$ hertz, wherein $f_{RF}$ is a transmission frequency.

20. The system of claim 15, wherein the analog representation of the OFDM symbol and the aliases occupy a band of the output signal that ranges from $f_{RF}$−B to $f_{RF}$+B, wherein $f_{RF}$ is a transmission frequency.

* * * * *